United States Patent
Albertini et al.

(10) Patent No.: US 10,122,367 B1
(45) Date of Patent: Nov. 6, 2018

(54) ISOLATED PHASE SHIFTED DC TO DC CONVERTER WITH FREQUENCY SYNTHESIZER TO RECONSTRUCT PRIMARY CLOCK

(71) Applicant: Texas Instruments Incorporated, Dallas, TX (US)

(72) Inventors: Pierluigi Albertini, Gropello Cairoli (IT); Maurizio Granato, Milan (IT); Roberto Giampiero Massolini, Via Bernardino da Feltre (IT); Giovanni Frattini, Travaco' Siccomario (IT)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/712,239

(22) Filed: Sep. 22, 2017

(51) Int. Cl.
- H03L 7/08 (2006.01)
- H03L 7/085 (2006.01)
- H02M 1/088 (2006.01)
- H02M 3/335 (2006.01)

(52) U.S. Cl.
CPC .......... H03L 7/0807 (2013.01); H02M 1/088 (2013.01); H02M 3/33584 (2013.01); H03L 7/085 (2013.01)

(58) Field of Classification Search
CPC ......... H02M 3/33507; H02M 3/33584; H02M 3/33592
USPC .............................................. 363/47, 89, 98
See application file for complete search history.

(56) References Cited

U.S. PATENT DOCUMENTS

| | | |
|---|---|---|
| 5,027,264 A | 6/1991 | DeDoncker et al. |
| 5,355,294 A | 10/1994 | DeDoncker et al. |
| 5,457,624 A | 10/1995 | Hastings |
| 5,481,449 A | 1/1996 | Kheraluwala et al. |
| 5,648,705 A | 7/1997 | Sitar et al. |

(Continued)

FOREIGN PATENT DOCUMENTS

EP 2757675 A2 7/2014

OTHER PUBLICATIONS

Zhang et al., "A High Efficiency Flyback Converter with New Active Clamp Technique", IEEE Transactions on Power Electronics, vol. 25, No. 7, Jul. 2010, pp. 1775-1785.

(Continued)

*Primary Examiner* — Jeffrey Sterrett
(74) *Attorney, Agent, or Firm* — Michael A. Davis, Jr.; Charles A. Brill; Frank D. Cimino (57) ABSTRACT

Disclosed examples include isolated phase shifted dual active bridge DC to DC converters with a first bridge circuit operative according to a primary side clock signal to provide a primary voltage signal to a transformer primary winding, a second bridge circuit operative according to a secondary side clock signal to convert a secondary voltage signal from a transformer secondary winding to provide an output voltage signal, and a secondary side control circuit that alternately operates in a first mode to regulate the output voltage signal by controlling a phase shift angle between switching transitions of secondary side switching control signals and switching transitions of the secondary side clock signal, and a second mode to discontinue the secondary side switching control signals and synchronize the secondary side clock signal to transitions in the secondary voltage signal while the secondary side switching control signals are discontinued.

20 Claims, 4 Drawing Sheets

(56) References Cited

U.S. PATENT DOCUMENTS

| | | |
|---|---|---|
| 6,441,598 B1 | 8/2002 | Ivanov |
| 6,686,729 B1 | 2/2004 | Kawamura et al. |
| 6,861,826 B2 | 3/2005 | Lynch |
| 8,963,529 B2 | 2/2015 | Cohen |
| 9,748,853 B1 | 8/2017 | Li |
| 2002/0141209 A1 | 10/2002 | Bridge |
| 2004/0070378 A1 | 4/2004 | Baldwin et al. |
| 2007/0121350 A1 | 5/2007 | Duvnjak |
| 2008/0212340 A1 | 9/2008 | Tao et al. |
| 2008/0298106 A1 | 12/2008 | Tateishi |
| 2009/0196072 A1 | 8/2009 | Ye |
| 2010/0027298 A1 | 2/2010 | Cohen |
| 2010/0182803 A1 | 7/2010 | Nan et al. |
| 2010/0315840 A1 | 12/2010 | Cohen |
| 2011/0090725 A1 | 4/2011 | Lu |
| 2011/0205764 A1 | 8/2011 | Sheng et al. |
| 2011/0249472 A1 | 10/2011 | Jain et al. |
| 2012/0081928 A1 | 4/2012 | Roessler et al. |
| 2012/0275198 A1 | 11/2012 | Cohen |
| 2013/0077356 A1 | 3/2013 | Cohen |
| 2013/0148385 A1 | 6/2013 | Zhang |
| 2013/0272036 A1 | 10/2013 | Fang |
| 2014/0003096 A1 | 1/2014 | Deng |
| 2014/0078782 A1* | 3/2014 | Rosado ............ H02M 3/33584 363/17 |
| 2015/0092454 A1 | 4/2015 | Cohen |
| 2015/0103563 A1 | 4/2015 | Wang |
| 2015/0214846 A1 | 7/2015 | Cohen |
| 2015/0365005 A1* | 12/2015 | Panov ............... H02M 3/33584 307/24 |
| 2016/0020702 A1* | 1/2016 | Trescases .......... H02M 3/33592 363/17 |
| 2016/0094137 A1 | 3/2016 | Jitaru et al. |
| 2016/0233779 A1 | 8/2016 | Cohen |
| 2016/0268909 A1 | 9/2016 | Liu et al. |

OTHER PUBLICATIONS

Received STIC search report from EIC 2800 searcher Benjamin Martin dated Mar. 13, 2018; 13 pages.

* cited by examiner

ISOLATED PHASE SHIFTED DC TO DC CONVERTER WITH FREQUENCY SYNTHESIZER TO RECONSTRUCT PRIMARY CLOCK

BACKGROUND

Isolated dual active bridge (DAB) converter circuits include first and second bridge circuits connected to primary and secondary sides of a transformer for DC to DC conversion. DAB converters can be used in unidirectional or bidirectional power conversion applications. The direction of power transfer is controlled by the leading or lagging phase relationship between switches of the first and second bridge circuits, where the bridge that is driven with a leading phase transmits power to the bridge operated with a lagging phase. Controlling the phase shift between the primary and secondary side bridge circuits allows control of the power flux and the amount of energy transferred through the isolation transformer. Isolated DAB converters provide low noise operation through linear control capabilities, along with the ability to implement zero voltage switching (ZVS) over a large phase shift range. These converters can also achieve lower RMS current levels for the same average output current compared to other types of DC to DC converters. However, the phase shift control mechanism requires operation of the primary and secondary bridge circuits according to shared clock information. Conventional isolated DAB converters use an isolated communication channel to share a clock between the primary and secondary sides, such as optical, capacitive or inductive circuits to transfer a clock signal from one side to the other. The shared clock can be used to implement closed-loop output voltage regulation by controlling the phase shift between the primary and secondary bridge switching signals. However, the additional isolated communication channel adds cost and complexity to the circuit designed and increases circuit area.

SUMMARY

Disclosed examples include DC to DC converters with first and second bridge circuits and a transformer to implement phase shift control without requiring a separate communication channel for sharing clock signals or information. A first bridge circuit operates according to a primary side clock signal to provide a primary voltage signal to a transformer primary winding. A second bridge circuit converts a voltage signal from a secondary winding to provide an output voltage signal. A secondary side control circuit operates in first and second modes, including a first mode to regulate the output voltage signal by controlling a phase shift angle between secondary side switching control signals and a secondary side clock signal. In a second mode, the secondary side control circuit discontinues the secondary side switching control signals and synchronizes the secondary side clock signal to transitions in the secondary voltage signal resulting from continued primary side switching operation. In certain examples, the secondary side control circuit implements the first mode for an integer number N secondary side clock cycles, and discontinues switching control in the second mode for an integer number M secondary side clock cycles, where N and M are greater than or equal to 1. In certain examples, the secondary side control circuit includes an analog front end circuit to provide a level shifted voltage signal according to the secondary voltage signal, as well as a clock recovery circuit to provide a recovered clock signal including transitions corresponding to transitions in the secondary voltage signal based on the level shifted voltage signal.

The secondary side control circuit in certain examples includes an interrupt circuit that selectively discontinues the secondary side switching control signals, as well as a frequency synthesizer to synchronize the secondary side clock signal to transitions in the secondary voltage signal while the secondary side switching control signals are discontinued. In one example, the frequency synthesizer includes a phase locked loop (PLL) with an output to provide the secondary side clock signal, a first input that receives the recovered clock signal, and a second input to receive a feedback clock signal based on the secondary side clock signal. In the first mode, the PLL maintains the secondary side clock signal at a constant frequency and phase to operate independent of the primary side clock. In the second mode, the PLL synchronizes the secondary side clock signal to transitions in the recovered clock signal. In certain examples, the secondary side control circuit includes a delay circuit that provides a delay clock signal with transitions delayed from the switching transitions of the secondary side clock signal by the phase shift angle. The control circuit in these examples further includes a driver circuit that provides the secondary side switching control signals with switching transitions that corresponds to the transitions of the delay clock signal, and a voltage control circuit provides a signal to the delay circuit to set the phase shift angle according to the output voltage signal and a setpoint signal.

Further disclosed examples include methods for operating a phase shifted dual active bridge DC to DC converter, including operating secondary switches according to a secondary side clock signal to convert a transformer secondary voltage signal to regulate a converter output voltage signal by controlling a phase shift angle between transitions of secondary side switching control signals and transitions of a secondary side clock signal. The method further includes discontinuing the secondary side switching control signals after an integer number N cycles of the secondary side clock signal, synchronizing the secondary side clock signal to the transitions in the transformer secondary voltage signal while the secondary side switching control signals are discontinued, and resuming the secondary side switching control signals after synchronizing the secondary side clock signal to the transitions in the transformer secondary voltage signal.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the terms "couple", "coupled" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 1:
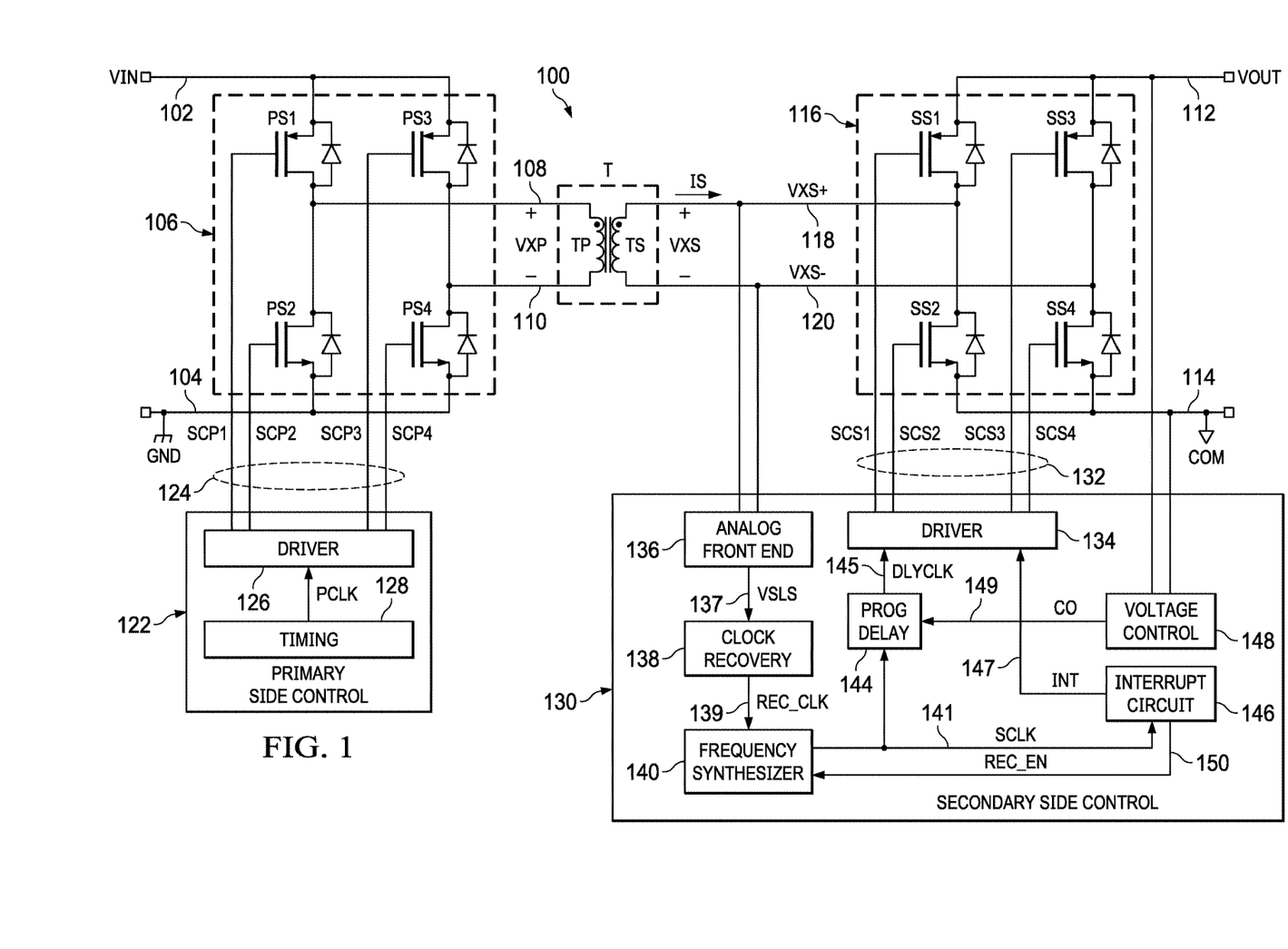
FIG. 1 is a schematic diagram of an isolated, phase shifted dual active bridge DC to DC converter.

FIG. 1 shows an isolated dual active bridge DC to DC converter 100 that implements phase shifted secondary side output voltage regulation without a separate communications channel for sharing clock information across an isolation barrier. The converter 100 selectively recovers synchronization between the primary and secondary side switching operation by selectively windowing or discontinuing secondary side switching in order to synchronize a secondary side clock signal to the primary side switching. The DC to DC converter 100 receives an input voltage signal VIN at a first bridge circuit input including first and second input terminals or nodes 102 and 104. In one example, the input signal VIN is a DC voltage signal applied to the first input terminal 102 at a positive voltage relative to the voltage (e.g., GND) of the second input terminal 104.

The input signal VIN is provided to a first bridge circuit 106 that includes primary switches PS1, PS2, PS3 and PS4 connected in a full bridge configuration. The primary switches PS1-PS4 are individually coupled between the first bridge circuit input 102, 104 and a bridge circuit output with nodes or terminals 108 and 110. The illustrated example includes field effect transistor type switches PS1-PS4, where PS1 and PS3 are high side PMOS transistors and PS2 and PS4 are low side NMOS resistors. In other possible implementations, bipolar transistors, IGBTs, or other types and forms of switching devices can be used. Although illustrated as a full bridge, the first bridge circuit 106 can be implemented as a half bridge circuit in other examples. The first bridge circuit output terminals 108 and 110 are connected to a primary winding TP of a transformer T. The first bridge circuit output terminal 108 connects the drains of PS1 and PS2 to a first end of the primary winding TP, and the second bridge circuit output terminal 110 connects the drains of PS3 and PS4 to the second end of the primary winding TP.

The primary switches PS1, PS2, PS3 and PS4 are operated according to corresponding primary side switching control signals SCP1, SCP2, SCP3 and SCP4 from a primary side control circuit 122 to convert the input signal VIN to provide an alternating primary voltage signal VXP to the primary winding TP. The primary side circuitry in certain implementations may also include one or more additional inductors (not shown) in series with the primary winding TP. In the illustrated example, the first and second primary switches PS1 and PS2 provide a first circuit branch or leg circuit between the input terminals 102 and 104, and the switches PS3 and PS4 provide a second circuit branch between the terminals 102 and 104. The primary side control circuit 122 includes a primary side driver circuit 126 with outputs 124 that provide the primary side switching control signals SCP1-SCP4, as well as a primary side timing circuit 128 that provides a primary side clock signal PCLK to the driver circuit 126 to control timing of the primary side switching control signals SCP1-SCP4. Any suitable timing circuit 128 can be used to provide a primary side clock signal PCLK, such as an oscillator. The driver circuitry 126 can include any suitable analog circuitry that selectively provides the signals SCP1-SCP4 at suitable levels to selectively actuate the corresponding switches PS1-PS4.

In the illustrated configuration using high side PMOS transistors PS1 and PS3 and NMOS low side transistors PS2 and PS4, a single switching control signal can be used for the transistors PS1 and PS2, and an inverse second control signal can be used for PS3 and PS4. For half bridge implementations, a single primary side switching control signal can be used to operate a high side PMOS transistor and a low side NMOS transistor. In one example, the switching control signals SCP1-SCP4 are provided as 50% duty cycle waveforms to control the switches to alternately turn on PS1 and PS4 while turning off PS2 and PS3 in a first half cycle of a primary side clock signal, and to then turn on PS2 and PS3 while turning off PS1 and PS4 in a second primary clock half cycle. Other implementations are possible in which different duty cycles can be used and various pulse width modulation (PWM) schemes can be employed. When PS1 and PS4 are turned on and PS2 and PS3 are off, the first output terminal 108 is connected to the first input terminal 102, and the second output terminal 110 is connected to the second input 104. This applies a positive voltage signal VXP to the primary winding TP. When PS2 and PS3 are turned on, the first output terminal 108 is connected to the second input terminal 104, and the second output terminal 110 is connected to the first input terminal 102 to apply a negative voltage signal VXP to the primary winding TP.

The alternating switching of the first bridge circuit transistors PS1-PS4 delivers an AC primary voltage signal VXP to the primary winding TP of the transformer T via the first bridge circuit output 108, 110. The alternating primary voltage signal VXP creates an alternating secondary voltage signal VXS at a secondary winding TS of the transformer T. A second bridge circuit 116 converts the secondary voltage signal VXS to provide an output voltage signal VOUT. The second bridge circuit 116 includes an input with terminals 118 and 120 connected to receive the secondary voltage signal VXS from the transformer secondary winding TS. The second bridge circuit 116 also includes secondary switches SS1, SS2, SS3 and SS4 which are individually coupled between the second bridge circuit input 118, 120 and a second bridge circuit output having output terminals 112 and 114. The second bridge circuit 116 provides the output voltage signal VOUT at the first output terminal 112 as a positive voltage relative to a common or reference voltage (e.g., COM) at the second output terminal 114. The secondary voltage signal VXS across the second bridge circuit input terminals 118 and 120 establishes a voltage VXS+ at the first input terminal 118 and a voltage VXS− at the second input terminal 120.

The secondary switches SS1, SS2, SS3 and SS4 operate according to one or more secondary side switching control signals SCS1, SCS2, SCS3 and SCS4 from a secondary side control circuit 130 to provide a DC output voltage signal VOUT at the second bridge circuit output 112, 114. In the illustrated example, the second bridge circuit 116 is a full bridge circuit, including four secondary switches SS1-SS4 individually coupled between the second bridge circuit input 118, 120 and the second bridge circuit output 112, 114. In another example, a half bridge configuration can be used. The second bridge circuit 116 in FIG. 1 includes high side PMOS transistors SS1 and SS3 and NMOS low side transistors SS2 and SS4. In the illustrated example, SS1 and SS2 form a first circuit branch or leg circuit between the output terminals 112 and 114, and the switches SS3 and SS4 provide a second circuit branch between the terminals 112 and 114. The individual secondary switches SS1-SS4 include body diodes as schematically shown in FIG. 1. In other possible implementations, bipolar transistors, IGBTs, or other types and forms of second bridge switching devices can be used.

The secondary side control circuit 130 includes one or more outputs 132 that provide the switching control signals SCS1-SCS4. The secondary side control circuit 130 in this example provides dual mode operation by switching between first and second operating modes. In the first mode, the circuit 130 provides the secondary side switching control signals SCS1-SCS4 to provide phase shifted control of the bridge circuit switches SS1-SS4 to convert the secondary voltage signal VXS and to provide the output voltage signal VOUT as a regulated DC voltage. The control circuit 130 implements a closed loop in the first operating mode to regulate the output voltage signal VOUT by controlling a phase shift angle $\phi$ between switching transitions of the secondary side switching control signals SCS1-SCS4 and switching transitions of a secondary side clock signal SCLK. In one example, the control circuit 130 provides the secondary side switching control signals SCS1-SCS4 as 50% duty cycle waveforms to control the switches to alternately turn on SS1 and SS4 while turning off SS2 and SS3 in a first half cycle of the secondary side clock signal SCLK, and to then turn on SS2 and SS3 while turning off SS1 and SS4 in a second secondary clock half cycle. Different secondary side duty cycles and PWM techniques can be used in other implementations.

In the illustrated example with high side PMOS transistors SS1 and SS3 and NMOS low side transistors SS2 and SS4, a single switching control signal can be used for the transistors SS1 and SS2, and a second control signal can be used for SS3 and SS4. Similarly, for half bridge implementations, the control circuit 130 can provide a single secondary side switching control signal to operate a high side PMOS transistor and a low side NMOS transistor. When SS1 and SS4 are turned on and SS2 and SS3 are off, secondary winding current IS flows from the second output terminal 114 through SS4, and through the secondary winding TS to the first output terminal 112 through SS1. When SS2 and SS3 are turned on and SS1 and SS4 are off, the secondary winding current IS flows from the second output terminal 114 through SS2, the secondary winding TS, and then through SS3 to the first output terminal 112. In this manner, the secondary bridge circuit provides active rectification to deliver a DC output voltage signal VOUT.

Figure 2:
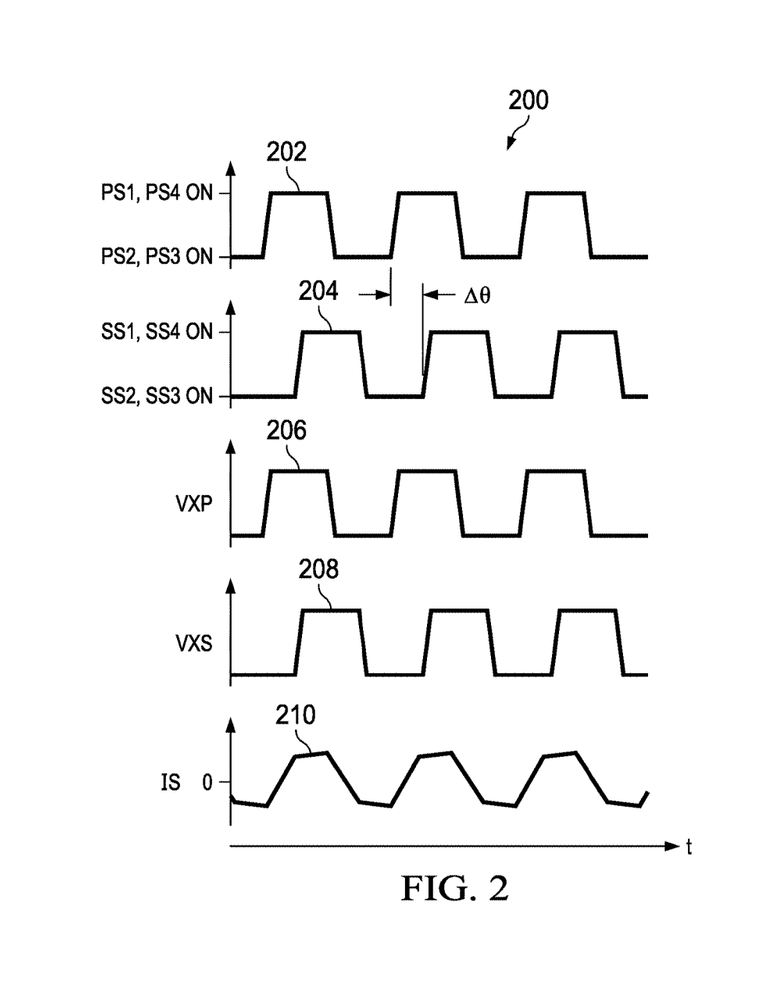
FIG. 2 is a signal diagram of signals in the DC to DC converter of FIG. 1.

FIG. 2 shows a signal diagram 200 that illustrates signals during first mode operation in the DC to DC converter 100. A curve 202 illustrates steady-state operation of the primary side first bridge circuit 106 according to the control signals SCP1-SCP4 from the control circuit 122, including a first state (HIGH in FIG. 2) in which PS1 and PS4 are turned on and the other primary side switches PS2 and PS3 are turned off, as well as a second state (LOW in FIG. 2) in which PS2 and PS3 are turned on and the other primary side switches PS1 and PS4 are turned off. The primary side control circuit 122 provides the switching control signals represented by the switching control curve 202 according to the primary side clock signal PCLK. FIG. 2 also shows a secondary side switching logic curve 204 that represents the control signals SCS1-SCS4 from the secondary side control circuit 130 during steady-state operation in the first mode. The curve 204 includes a first state (HIGH) representing SS1 and SS4 being turned on, and SS2, SS3 being turned off, as well as a second state (LOW) representing the situation where SS2, SS3 are on and SS1, SS4 are off. The secondary side control circuit 130 provides the switching control signals SCS1-SCS4 according to a feedback-adjusted delay relative to switching transitions of the secondary side clock signal SCLK. In normal operation, this provides a feedback-adjusted phase angle difference $\Delta\theta$ between the curves 202 and 204, where the rising edge transitions and falling edge transitions of the primary side curve 202 lead the transitions in the secondary side curve 204. A curve 206 in FIG. 2 shows the primary voltage signal VXP, and a curve 208 shows the secondary voltage signal VXS. The secondary current IS is illustrated by a curve 210 in FIG. 2. The second bridge circuit 116 operates during steady-state conditions in the first mode to convert the alternating secondary voltage signal VXS to provide a regulated DC output voltage signal VOUT at the second bridge circuit output 112, 114 to drive an attached load (not shown).

The secondary side control circuit 130 operates independently with respect to the primary side clock signal PCLK in the first mode. In operation, the secondary side control circuit 130 internally generates the secondary side clock signal SCLK and implements a variable delay closed loop to control the relative timing of the transitions in the secondary side switching control signals SCS1-SCS4 to selectively adjust the output voltage signal VOUT based on an internal or external setpoint signal. The secondary side control circuit 130 includes a driver circuit 134 with one or more outputs 132 that provide the secondary side switching control signals SCS1-SCS4 to the second bridge circuit 116. The control circuit 130 also includes an analog front end circuit 136 with an input connected to the second bridge circuit input terminals 118 and 120 to receive or sense the secondary voltage signal VXS from the secondary winding TS. The analog front end circuit in one example includes a level shifting circuit and filter circuitry to provide a level shifted voltage signal VSLS at an output 137.

In practice, the signals VXS+ and VXS− at the nodes 118 and 120 may be at a higher voltage than the circuitry of the secondary side control circuit 130, and the analog front end circuit 136 provides level shifting to generate the signal VSLS at a suitable level for recovering clock signal information during the second operating mode. In addition, the analog front end circuit 136 in certain examples includes low pass filtering circuitry, such as capacitors, to remove high-frequency components from the sensed secondary voltage signal VXS to deliver a filtered, level shifted voltage signal VSLS. A clock recovery circuit 138 includes an input connected to the front end circuit output 137 to receive the level shifted voltage signal VSLS, and an output 139 that provides a recovered clock signal REC_CLK. The recovered clock signal REC_CLK includes transitions corresponding to the transitions in the secondary voltage signal VXS. As used herein, transitions in an alternating signal include rising and falling edges. The clock recovery circuit 138 in one example includes a comparator circuit (not shown) that compares the level shifted voltage signal VSLS to a threshold voltage signal, and the comparator output provides the recovered clock signal REC_CLK with discernible rising and falling edges corresponding to the main rising and falling transitions in the secondary voltage signal VXS from the secondary winding TS.

The secondary side control circuit 130 also includes a frequency synthesizer circuit 140 with an output 141 that provides the secondary side clock signal SCLK. The frequency synthesizer circuit 140 includes an input connected to the output 139 of the clock recovery circuit 138 to receive the recovered clock signal REC_CLK, as well as an enable input to receive a recovery enable signal REC_EN. The secondary side control circuit 130 further includes a delay circuit 144 (PROG DELAY in FIG. 1). The delay circuit 144 includes a first input to receive the secondary side clock signal SCLK from the frequency synthesizer 140, as well as a second input to receive a control output signal CO to set a phase shift angle φ for regulating the output voltage signal VO. The delay circuit 144 also includes an output 145 that provides a delay clock signal DLYCLK to the driver circuit 134. In operation in the first mode, the driver circuit 134 generates the secondary side switching control signals SCS1-SCS4 at the outputs 132 having transitions that correspond to the transitions of the delay clock signal DLYCLK.

The secondary side control circuit 130 further includes a voltage control circuit 148 with an output 149 coupled with the second input of the delay circuit 144 to provide the control output signal CO. The voltage control circuit 148 selectively adjusts the control output signal CO to set the phase shift angle φ used in closed-loop regulation in the first mode according to the output voltage signal VOUT and a setpoint signal SP. The delay clock signal DLYCLK includes transitions delayed by the phase shift angle φ from the switching transitions of the secondary side clock signal SCLK. This operation ensures that the secondary side control circuit 130 operates the switches of the second bridge circuit 116 in phase shifted manner relative to transitions of the secondary side clock signal SCLK. In operation in the first mode, the driver 134 generates the secondary side switching control signals without any communications channel across the isolation barrier from the primary side control circuit 122.

Figure 3:
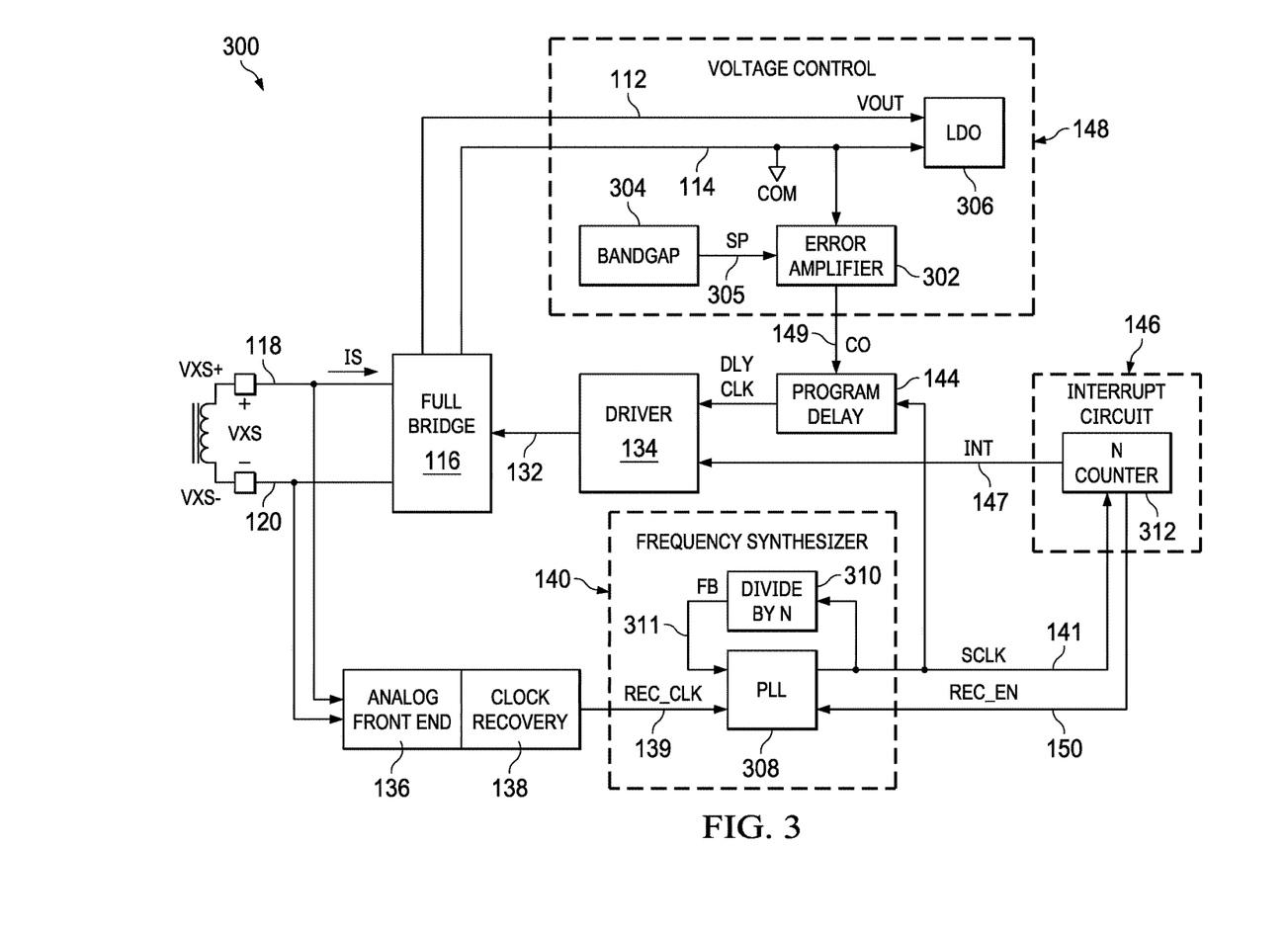
FIG. 3 is a schematic diagram showing further details of the DC to DC converter.
Figure 4:
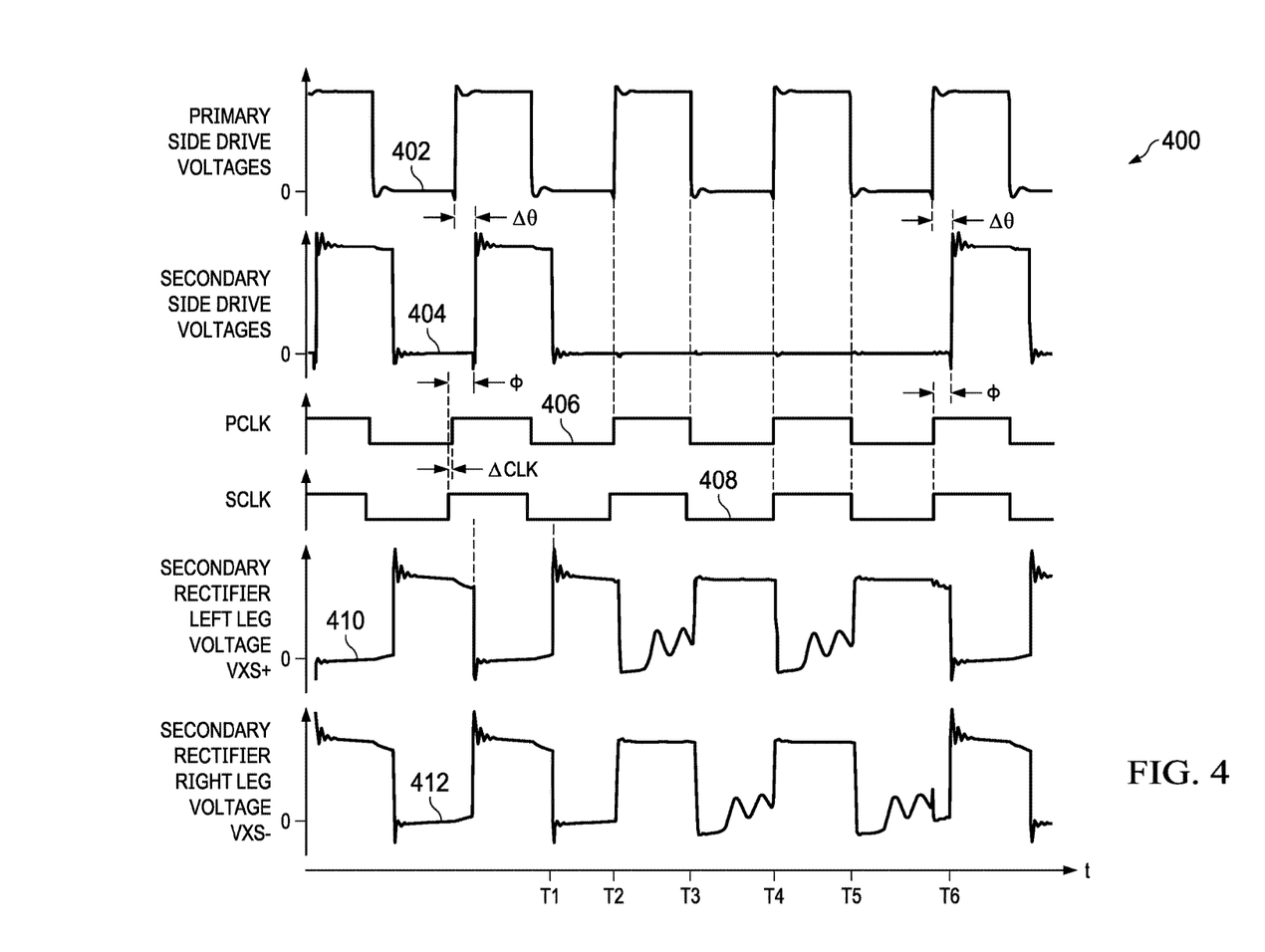
FIG. 4 is a signal diagram of signals in the DC to DC converter of FIGS. 1 and 3 before, during and after clock synchronization.

Referring also to FIGS. 3 and 4, the secondary side control circuit 130 alternates between the first and second operating modes. FIG. 3 shows further details of the DC to DC converter 100, and FIG. 4 shows a signal diagram 400 that illustrates signals in the DC to DC converter 100 before, during and after clock synchronization. As best seen in FIG. 3, the voltage control circuit 148 in one example includes an error amplifier circuit 302 and a bandgap reference circuit 304 with an output 305 that provides a setpoint signal SP for regulation of the output voltage VOUT. In one example, the output voltage signal VOUT is provided as an input to a low dropout (LDO) regulator circuit 306 that drives a connected load (not shown). As the voltage control circuit 148 provides closed-loop regulation of the output voltage signal VOUT, the LDO regulator circuit 306 can be omitted in other implementations.

In operation, the error amplifier 302 senses the output voltage signal VOUT at the node 112 and compares the output voltage to the setpoint signal SP from the bandgap reference circuit 304, and generates the control output signal CO at the voltage control circuit output 149. The programmable delay circuit 144 selectively adjusts the delay clock signal DLYCLK used by the driver 134 to set the phase angle of the switching control signals provided at the outputs 132 to the switches of the second bridge circuit 116. In this manner, closed loop voltage regulation is achieved to regulate the output voltage signal VOUT according to the setpoint signal SP. As previously mentioned, the relative phase angle Δθ between the primary and secondary side switching control signals (FIG. 2 above) controls the amount of energy transfer from the primary side first bridge circuit 106 to the second bridge circuit 116, and thus controlled phase shifted operation of the bridge circuits 106, 116 provides control over the output voltage signal level VOUT. The disclosed phase shifted dual active bridge DC to DC converter circuit 100, moreover, achieves this control capability without a dedicated communication channel for transferring clock information between the primary and secondary circuits.

In order to facilitate accurate synchronization between the primary and second side clock signals PCLK and SCLK without a separate dedicated communication channel to transfer clock signal or synchronization information between the primary and secondary sides of the transformer T, the secondary side control circuit 130 synchronizes the closed loop output regulation with respect to the primary side clock signal PCLK by selectively switching to a second mode to discontinue the secondary side switching control signals SCS1-SCS4. In addition, the secondary side control circuit 130 synchronizes the secondary side clock signal SCLK to transitions in the secondary voltage signal VXS while the secondary side switching control signals SCS1-SCS4 are discontinued in the second mode. In this manner, the control circuit 130 recovers the primary side clock relationship to facilitate phase shifted output voltage control.

In one example, the secondary side control circuit 130 operates in the first mode for an integer number N cycles of the secondary side clock signal SCLK, and then operates in the second mode for an integer number M cycles of the secondary side clock signal SCLK before returning to the first mode, where N and M are greater than or equal to 1. In one example, N is greater than or equal to 100. In certain implementations, moreover, M=2 in order to allow sufficient time for the clock recovery and frequency synthesizer circuitry in the secondary side control circuit 130 to synchronize the secondary side clock signal SCLK to the primary side clock signal PCLK. In the first mode, the secondary side control circuit 130 provides the secondary side switching control signals SCS1-SCS4 to regulate the output voltage signal VOUT by controlling the phase shift angle φ between switching transitions of the secondary side switching control signals SCS1-SCS4 and the switching transitions of a secondary side clock signal SCLK.

In the Example of FIG. 3, the control circuit 130 includes an interrupt circuit 146 that controls the transitions between the first and second operating modes. In the illustrated example, the interrupt circuit 146 includes an output that provides an interrupt signal INT to cause the driver circuit 134 to selectively discontinue the secondary side switching control signals SCS1-SCS4 for operation in the second mode. In addition, the example interrupt circuit 146 includes a second output 150 that provides the clock recovery enable signal REC_EN to the frequency synthesizer circuit 140. In the second mode, the frequency synthesizer circuit 140 synchronizes the secondary side clock signal SCLK to transitions in the secondary voltage signal VXS while the secondary side switching control signals SCS1-SCS4 are discontinued. In the example of FIG. 3, the interrupt circuit 146 includes a counter 312 with an input connected to the output 141 of the frequency synthesizer circuit 140 to receive the secondary side clock signal SCLK. The counter 312 is configured to count up to the integer number N. In certain implementations, N is adjustable to allow programming by a host circuit (not shown).

The counter 312 includes a first output 147 that provides the interrupt signal INT to the driver circuit 134 in a first state (e.g., HIGH) to cause the driver circuit 134 to selectively discontinue the secondary side switching control signals SCS1-SCS4 in response to the counter 312 counting N cycles of the secondary side clock signal SCLK. In this example, the first output 147 of the counter 312 of the interrupt circuit 146 provides the interrupt signal INT in the first state for an integer number M cycles of the secondary side clock signal SCLK, and then provides the interrupt signal INT in a different second state (e.g., LOW) to cause the driver circuit 134 to resume the secondary side switching control signals SCS1-SCS4 while the counter 312 counts another N cycles of the secondary side clock signal SCLK. This operation repeats to alternate between operation in the first and second modes.

The counter 312 includes a second output 150 to provide the recovery enable signal REC_EN in a first state (e.g., HIGH) while the interrupt signal INT is in the first state. The second output 150 in one example provides the enable signal REC_EN in the first state for M cycles of the secondary side clock signal SCLK to cause the frequency synthesizer circuit 140 to synchronize the secondary side clock signal SCLK to transitions in the secondary voltage signal VXS while the interrupt signal INT is in the first state. Then, the output 150 provides the enable signal REC_EN in a different second state (e.g., LOW) to cause the cause the frequency synthesizer circuit 140 to maintain the secondary side clock signal SCLK at a constant frequency and phase while the interrupt signal INT is in the second state.

In this manner, the frequency synthesizer circuit 140 provides a stable secondary clock signal SCLK during the first mode, and the voltage control circuit 148 selectively adjusts the control output signal CO according to the output voltage VOUT and the setpoint SP for closed loop output voltage regulation. This operation continues for N consecutive cycles of the clock signal SCLK (e.g., N>>M), with brief interruptions for clock synchronization in the second mode for M cycles of the signal SCLK.

As further shown in FIG. 3, the frequency synthesizer circuit 140 in one example is, or includes, a phase locked loop (PLL). The PLL 308 has various inputs as well as a PLL output 141 that provides the secondary side clock signal SCLK. The PLL 308 includes a first input connected to the output 139 of the clock recovery circuit 138 to receive the recovered clock signal REC_CLK. During clock synchronization (clock recovery) operation in the second mode when the enable signal REC_EN is in the first state, the PLL 308 adjusts the frequency and phase of the secondary side clock signal SCLK at the output 141 in order to align the transitions of the recovered clock signal REC_CLK with transitions in a feedback clock signal FB received at a second input. The PLL 308 also includes a third input coupled with the second output 150 of the interrupt circuit 146 to receive the enable signal REC_EN. In one example, the second input is connected to the PLL output 141 to directly receive the secondary side clock signal SCLK, and the PLL 308 synchronizes the switching transitions of the secondary side clock signal SCLK to transitions in the feedback clock signal FB in the second mode when the enable signal REC_EN is in the first state. In the example of FIG. 3, the frequency synthesizer circuit 140 also includes a divider circuit 310, with an input connected to the PLL output 141 to receive the secondary side clock signal SCLK, and an output 311 connected to the second input of the PLL 308. In this example, the divider circuit divides by the integer number N, which is the same integer value used by the counter 312. The PLL 308 in this example synchronizes the switching transitions of the secondary side clock signal SCLK to transitions in the feedback clock signal FB during synchronization operation in the second mode.

During operation in the first mode when the recovery enable signal REC_EN is in the second state, the PLL 308 maintains the secondary side clock signal SCLK at a constant frequency and phase. In one example, the frequency synthesizer circuit 140 disables the feedback of the PLL circuit 308 when the recovery enable signal REC_EN is in the second state. For example, the circuit 140 can include a switch (not shown) to selectively connect the feedback signal FB to the second PLL input when REC_EN is in the first state (second mode operation), and to connect the second PLL input to the first PLL input (REC_CLK) when REC_EN is in the second state (first mode operation).

FIG. 4 shows a signal diagram 400 including signals in the DC to DC converter 100 before, during and after clock synchronization. In particular, FIG. 4 illustrates primary and secondary drive voltage curves 402 and 404, respectively, as well as primary and secondary side clock signal curves 404 and 406, and secondary rectifier left and right leg voltage curves 410 and 412 over time "t". The diagram 400 illustrates initial operation in the first mode operation, followed by transition through the second mode operation for M=2 cycles of the secondary side clock signal SCLK, and then subsequent transition back to the first mode operation. The curve 402 represents the primary side switching control signals SCP1-SCP4 applied to the switches PS1-PS4. A high signal state in the curve 402 indicates that PS1 and PS4 are on and PS2 and PS3 are off, and a low state in the curve 402 indicates that PS2 and PS3 are on and PS1 and PS4 are off. Similarly, the curve 404 represents the secondary side switching control signals SCS1-SCS4, where a high signal state in the curve 404 indicates that SS1 and SS4 are on and SS2 and PS3 are off, and a low state in the curve 404 indicates that SS2 and SS3 and PS3 are on and SS1 and SS4 are off. During the initial operation in the first mode (e.g., until the counter 312 of FIG. 3 counts to N), the secondary side control circuit 130 provides the secondary side switching control signals to operate the switches as shown in the curve 404.

As shown in FIG. 4, various drift mechanisms may cause a deviation in time or a phase shift ΔCLK between the primary and secondary side clock signal curves 406 and 408. During first mode operation, moreover, the frequency synthesizer circuit 140 maintains the secondary side clock signal SCLK at a constant frequency and phase. At the same time, the voltage control circuit 148 provides closed loop control of the output voltage VOUT using the control output signal CO to set the phase shift angle φ between the switching transitions of the secondary side switching control signals SCS1-SCS4 (curve 404) and switching transitions of the secondary side clock signal SCLK (curve 408). The direct secondary side control of the phase shift angle φ results in a relative phase shift angle Δθ between the transitions of the primary side switching control signals (curve 402) and the secondary side switching control signals (curve 404). This latter value Δθ determines the power transfer level between the primary and secondary bridge circuits 106 and 116.

At time T1 in FIG. 4, the counter 312 (FIG. 3) reaches a value of N, and the interrupt circuit 146 issues the interrupt signal INT to the secondary side driver circuit 134. This causes the driver circuit 134 to discontinue provision of the secondary side switching control signals from time T1 through time T6 in FIG. 4. Accordingly, the secondary side drive voltage curve 404 remains low for M=2 cycles of the secondary side clock signal SCLK (curve 408). During this interval, the secondary side control circuit 130 operates in the second mode in order to synchronize the primary and secondary side clock signals shown in curves 406 and 408. During this time, moreover, the body diodes of the secondary bridge switches SS1-SS4 (FIG. 1) continue to conduct when forward biased to provide passive rectification, and switching of the primary bridge circuit 106 continues, causing alternating secondary voltages VXS. The analog front end circuit 136 and the clock recovery circuit 138 detect transitions in the secondary voltage VXS, and provide the recovered clock signal REC_CLK to the activated PLL 308 of the frequency synthesizer circuit 140 (FIG. 3).

At time T2 in FIG. 4, the next rising edge in the primary side drive voltage curve 402 causes a downward transition in the secondary rectifier left leg voltage signal curve 410 (VSX+) and a corresponding upward transition in the secondary rectifier right leg voltage signal curve 412 (VSX−). The transitions are followed by ringing in the VXS+ curve 410 until time T3 at which the next falling edge in the primary side drive voltage curve 402 occurs. This causes a rising transition in the curve 410 and a falling transition in the curve 412, followed by ringing in the curve 412. At time T4, a subsequent rising edge in the curve 402 causes a falling transition in the curve 410 and a rising transition in the curve 412, followed by ringing in the curve 410. A subsequent falling edge in the curve 402 at T5 causes a rising edge in the curve 410 and a falling edge in the curve 412, with ringing thereafter in the curve 412. As shown in FIG. 4, the rising and falling edge transitions in the curves 410 and 412 at T2, T3, T4 and T5 are sensed and filtered by the analog front end circuit 136, and the filtering circuitry in the analog front end circuit 136 removes the ringing and other high-frequency artifacts of the secondary voltage signal waveforms 410 and 412. The clock recovery circuit 138 compares the resulting filtered, voltage shifted signal VSLS with a threshold signal to provide the recovered clock signal REC_CLK for use by the PLL 308 to synchronize the secondary side clock signal SCLK.

The initial discrepancy ΔCLK between the primary and secondary side clock signals 406 and 408 prior to second mode operation is corrected by the clock recovery and frequency synthesizer circuitry of the secondary side control circuit 130, and the clock signals 406 and 408 are substantially synchronized (e.g., temporally aligned) by T4 and T5. Following M=2 cycles of the secondary side clock signal SCLK in the second mode, the interrupt circuit 146 removes the interrupt signal INT and the recovery enable signal REC_EN at T6, and the driver circuit 134 again resumes provision of the secondary side switching control signals SCS1-SCS4 as shown by curve 404. After T6, the first mode closed loop output voltage regulation resumes and the voltage control circuit 148 controls the phase shift angle φ representing the delay between the transitions in the secondary side clock signal (curve 408) and the secondary side drive signals (curve 404). This phase shifted control again controls the relative phase shift angle Δθ between the transitions of the primary side switching control signals (curve 402) and the secondary side switching control signals (curve 404).

Figure 5:
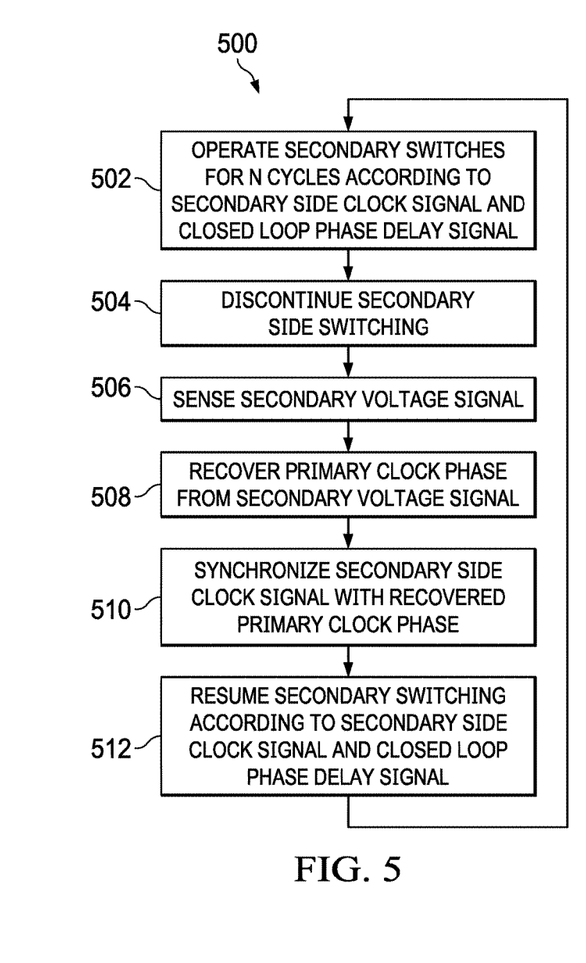
FIG. 5 is a flow diagram of a method for operating a DC to DC converter.

FIG. 5 shows a method 500 for operating a DC to DC converter according to further aspects of the present disclosure. The method 500 begins at 502 with operating secondary switches of a dual active bridge DC to DC converter (e.g., converter 100 above) according to a secondary side clock signal (SCLK) to convert a transformer secondary voltage signal (VXS) to regulate a converter output voltage signal (VOUT). In one example, as discussed above, the operation of 502 is implemented by controlling a phase shift angle φ between switching transitions of secondary side switching control signals SCS1-SCS4 and switching transitions of a secondary side clock signal SCLK. At 504, the method 500 includes discontinuing the secondary side switching control signals SCS1-SCS4, for example, after an integer number N cycles of the secondary side clock signal SCLK. At 506, the secondary side voltage signal is sensed (e.g., VXS), and the primary clock phase is recovered at 508 from the secondary voltage signal (e.g., using the analog front end circuit 136 and clock recovery circuit 138 of FIG. 1 above). At 510, the secondary side clock signal SCLK is synchronized to the transitions in the transformer secondary voltage signal VXS while the secondary side switching control signals SCS1-SCS4 are discontinued, and the secondary side switching control signals SCS1-SCS4 are resumed at 512 after synchronizing 510 the secondary side clock signal SCLK to the transitions in the transformer secondary voltage signal VXS.

The disclosed examples advantageously provide primary to secondary side clock information synchronization without separate communication channels and associated isolation circuitry by refraining from driving the secondary side during small windows of second mode operation (e.g., 2 secondary side clock cycles) every N switching cycles, and selectively sensing the secondary voltage during the second mode operation to recover a low frequency copy of the primary side clock. An example of using the divider circuit 310, the recovered frequency is low (e.g., 1/N), but the phase information is correct to allow secondary side clock synchronization based on the recovered primary side clock transitions sensed that the secondary winding TS. The PLL 308 scales up the secondary side clock signal, and provides the clock SCLK for use by the programmable delay 144 in controlling the driver circuit 134. The value of N can be relatively large, e.g., greater than or equal to 100 in certain implementations, and can be set small enough to ensure reliable synchronization of the primary and secondary side clock signals PCLK and SCLK in consideration of any relevant drift parameters associated with a circuit implementation. For very high values of N, the static phase error of the PLL 308 could become too large to be neglected, and the closed-loop operation to control the output voltage VOUT can introduce an output tone at f/N on the output of the DC to DC converter 100. The disclosed examples provide communication channel-free solutions to allow secondary side phase shifted regulation for dual active bridge DC to DC converters by reconstructing the primary clock in a frequency synthesizer based on sensed secondary winding voltage signals. This advantageously saves cost, complexity, and circuit size compared to prior solutions using isolated communication channels to transfer clock information, while allowing secondary side regulation with the primary side clock information being recovered through intelligent sensing during the second mode operation.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An isolated DC to DC converter, comprising:
   a transformer, including a primary winding, and a secondary winding;
   a first bridge circuit, including first bridge circuit input to receive an input signal, a first bridge circuit output coupled with the primary winding, and a plurality of primary switches individually coupled between the first bridge circuit input and the first bridge circuit output, the primary switches operative according to primary side switching control signals to provide a primary voltage signal to the first bridge circuit output;

a second bridge circuit, including a second bridge circuit input coupled to receive a secondary voltage signal from the secondary winding, a second bridge circuit output, and a plurality of secondary switches individually coupled between the second bridge circuit input and the second bridge circuit output, the secondary switches operative according to secondary side switching control signals to provide an output voltage signal at the second bridge circuit output;

a primary side control circuit configured to provide the primary side switching control signals according to a primary side clock signal; and a secondary side control circuit configured to provide the secondary side switching control signals to regulate the output voltage signal by controlling a phase shift angle between switching transitions of the secondary side switching control signals and switching transitions of a secondary side clock signal, the secondary side control circuit including:
an interrupt circuit configured to selectively discontinue the secondary side switching control signals, and
a frequency synthesizer circuit configured to synchronize the secondary side clock signal to transitions in the secondary voltage signal while the secondary side switching control signals are discontinued.

2. The isolated DC to DC converter of claim 1, wherein the primary side control circuit includes:
a primary side driver circuit, including a plurality of outputs to provide the primary side switching control signals; and
a primary side timing circuit to provide the primary side clock signal to the primary side driver circuit to control timing of the primary side switching control signals.

3. The isolated DC to DC converter of claim 1, wherein the secondary side control circuit includes:
an analog front end circuit, including an input coupled to receive the secondary voltage signal from the secondary winding, a level shifting circuit, a filter circuit, and an output to provide a level shifted voltage signal according to the secondary voltage signal; and
a clock recovery circuit, including an input coupled with the output of the analog front end circuit to receive the level shifted voltage signal, and an output coupled with an input of the frequency synthesizer circuit to provide a recovered clock signal including transitions corresponding to the transitions in the secondary voltage signal.

4. The isolated DC to DC converter of claim 3, wherein the secondary side control circuit includes:
a delay circuit, including a first input to receive the secondary side clock signal, a second input to receive a control output signal to set the phase shift angle, and an output to provide a delay clock signal including transitions delayed by the phase shift angle from the switching transitions of the secondary side clock signal;
a secondary side driver circuit, including an input coupled with the output of the delay circuit to receive the delay clock signal, and a plurality of outputs to provide the secondary side switching control signals having switching transitions corresponding to the transitions of the delay clock signal; and
a voltage control circuit, including an output coupled with the second input of the delay circuit to provide the control output signal to set the phase shift angle according to the output voltage signal and a setpoint signal.

5. The isolated DC to DC converter of claim 4, wherein the interrupt circuit includes:
a counter with an input coupled to receive the secondary side clock signal;
a first output to provide an interrupt signal in a first state to cause the secondary side driver circuit to selectively discontinue the secondary side switching control signals in response to the counter counting an integer number N cycles of the secondary side clock signal, N being greater than or equal to 1; and
a second output to provide an enable signal in a first state to cause the frequency synthesizer circuit to synchronize the secondary side clock signal to transitions in the secondary voltage signal while the interrupt signal is in the first state.

6. The isolated DC to DC converter of claim 5,
wherein the first output of the interrupt circuit is configured to provide the interrupt signal in the first state for an integer number M cycles of the secondary side clock signal, and then to provide the interrupt signal in a different second state to cause the secondary side driver circuit to resume the secondary side switching control signals while the counter counts another N cycles of the secondary side clock signal, M being greater than 1, and
wherein the second output of the interrupt circuit is configured to provide the enable signal in the first state for M cycles of the secondary side clock signal to cause the frequency synthesizer circuit to synchronize the secondary side clock signal to transitions in the secondary voltage signal while the interrupt signal is in the first state, and then to provide the enable signal in a different second state to cause the cause the frequency synthesizer circuit to maintain the secondary side clock signal at a constant frequency and phase while the interrupt signal is in the second state.

7. The isolated DC to DC converter of claim 5, wherein the frequency synthesizer circuit includes:
a phase locked loop (PLL), including:
a PLL output to provide the secondary side clock signal,
a first input coupled to receive the recovered clock signal from the output of the clock recovery circuit,
a second input coupled with the PLL output to receive a feedback clock signal based on the secondary side clock signal, and
a third input coupled with the second output of the interrupt circuit to receive the enable signal,
wherein the PLL is operative when the enable signal is in the first state to synchronize the switching transitions of the secondary side clock signal to transitions in the recovered clock signal, and wherein the PLL is operative when the enable signal is in the second state to maintain the secondary side clock signal at a constant frequency and phase.

8. The isolated DC to DC converter of claim 5, wherein N is greater than or equal to 100.

9. The isolated DC to DC converter of claim 1, wherein the secondary side control circuit includes:
a delay circuit, including a first input to receive the secondary side clock signal, a second input to receive a control output signal to set the phase shift angle, and an output to provide a delay clock signal including transitions delayed by the phase shift angle from the switching transitions of the secondary side clock signal;

a secondary side driver circuit, including an input coupled with the output of the delay circuit to receive the delay clock signal, and a plurality of outputs to provide the secondary side switching control signals having switching transitions corresponding to the transitions of the delay clock signal; and a voltage control circuit, including an output coupled with the second input of the delay circuit to provide the control output signal to set the phase shift angle according to the output voltage signal and a setpoint signal.

10. The isolated DC to DC converter of claim 1, wherein the interrupt circuit includes:

a counter with an input coupled to receive the secondary side clock signal;

a first output to provide an interrupt signal in a first state to selectively discontinue the secondary side switching control signals in response to the counter counting an integer number N cycles of the secondary side clock signal, N being greater than or equal to 1; and a second output to provide an enable signal in a first state to cause the frequency synthesizer circuit to synchronize the secondary side clock signal to transitions in the secondary voltage signal while the interrupt signal is in the first state.

11. The isolated DC to DC converter of claim 10, wherein the first output of the interrupt circuit is configured to provide the interrupt signal in the first state for an integer number M cycles of the secondary side clock signal, and then to provide the interrupt signal in a different second state to resume the secondary side switching control signals while the counter counts another N cycles of the secondary side clock signal, M being greater than 1, and wherein the second output of the interrupt circuit is configured to provide the enable signal in the first state for M cycles of the secondary side clock signal to synchronize the secondary side clock signal to transitions in the secondary voltage signal while the interrupt signal is in the first state, and then to provide the enable signal in a different second state to maintain the secondary side clock signal at a constant frequency and phase while the interrupt signal is in the second state.

12. The isolated DC to DC converter of claim 10, wherein the frequency synthesizer circuit includes:

a phase locked loop (PLL), including:

a PLL output to provide the secondary side clock signal, a first input coupled to receive a recovered clock signal including transitions corresponding to the transitions in the secondary voltage signal, a second input coupled with the PLL output to receive a feedback clock signal based on the secondary side clock signal, and a third input coupled with the second output of the interrupt circuit to receive the enable signal, wherein the PLL is operative when the enable signal is in the first state to synchronize the switching transitions of the secondary side clock signal to transitions in the recovered clock signal, and wherein the PLL is operative when the enable signal is in the second state to maintain the secondary side clock signal at a constant frequency and phase.

13. The isolated DC to DC converter of claim 1, wherein the first bridge circuit is a full bridge circuit, including four primary switches individually coupled between the first bridge circuit input and the first bridge circuit output; and wherein the second bridge circuit is a full bridge circuit, including four secondary switches individually coupled between the second bridge circuit input and the second bridge circuit output.

14. A phase shifted dual active bridge DC to DC converter, comprising:

a first bridge circuit configured to convert an input signal to provide a primary voltage signal to a primary winding of a transformer according to a primary side switching control signal;

a primary side control circuit configured to provide the primary side switching control signal according to a primary side clock signal;

a second bridge circuit configured to convert a secondary voltage signal from a secondary winding of the transformer to provide an output voltage signal according to a secondary side switching control signal;

a secondary side control circuit operative in a first mode to provide the secondary side switching control signal to regulate the output voltage signal by controlling a phase shift angle between switching transitions of the secondary side switching control signal and switching transitions of a secondary side clock signal, the secondary side control circuit operative in a second mode to discontinue the secondary side switching control signal, and to synchronize the secondary side clock signal to transitions in the secondary voltage signal while the secondary side switching control signal is discontinued.

15. The phase shifted dual active bridge DC to DC converter of claim 14, wherein the secondary side control circuit alternates between the first and second modes, wherein the secondary side control circuit operates in a first mode for an integer number N cycles of the secondary side clock signal, and wherein the secondary side control circuit operates in the second mode for an integer number M cycles of the secondary side clock signal, N and M being greater than 1.

16. The phase shifted dual active bridge DC to DC converter of claim 15, wherein N is greater than or equal to 100, and wherein M is 2.

17. The phase shifted dual active bridge DC to DC converter of claim 15, wherein the secondary side control circuit includes a phase locked loop (PLL), the PLL including:

a PLL output to provide the secondary side clock signal;

a first input coupled to receive a recovered clock signal that indicates the transitions in the secondary voltage signal;

a second input coupled with the PLL output to receive a feedback clock signal based on the secondary side clock signal; and a third input coupled with a second output of an interrupt circuit to receive an enable signal;

wherein the PLL operates in the second mode when the enable signal is in a first state to synchronize the switching transitions of the secondary side clock signal to transitions in the recovered clock signal, and wherein the PLL operates in the first mode when the enable signal is in a second state to maintain the secondary side clock signal at a constant frequency and phase.

18. A method for operating a phase shifted dual active bridge DC to DC converter, the method comprising:

operating secondary switches of a dual active bridge DC to DC converter to convert a transformer secondary voltage signal to regulate a converter output voltage signal by controlling a phase shift angle between switching transitions of secondary side switching control signals and switching transitions of a secondary side clock signal;

discontinuing the secondary side switching control signals after an integer number N cycles of the secondary side clock signal, N being greater than 1;

synchronizing the secondary side clock signal to transitions in the transformer secondary voltage signal while the secondary side switching control signals are discontinued; and resuming the secondary side switching control signals after synchronizing the secondary side clock signal to the transitions in the transformer secondary voltage signal.

19. The method of claim 18, comprising discontinuing the secondary side switching control signals for an integer number M cycles of the secondary side clock signal before resuming the secondary side switching control signals.

20. The method of claim 19, wherein N is greater than or equal to 100, and wherein M is 2.

\* \* \* \* \*